United States Patent [19]

Bradley

[11] Patent Number: 4,858,097
[45] Date of Patent: Aug. 15, 1989

[54] SWITCHING POWER SUPPLY WITH AN INJECTION SIGNAL FREQUENCY LOCKING CIRCUIT

[75] Inventor: Donald A. Bradley, Morgan Hill, Calif.

[73] Assignee: Wiltron Company, Morgan Hill, Calif.

[21] Appl. No.: 290,828

[22] Filed: Dec. 22, 1988

[51] Int. Cl.$^4$ .............................................. H02M 1/08
[52] U.S. Cl. ........................................ 363/41; 363/17; 363/98
[58] Field of Search ....................... 363/17, 41, 56, 97, 363/98, 131–134; 323/280, 288, 241, 242, 326

[56] References Cited

U.S. PATENT DOCUMENTS

| | | | |
|---|---|---|---|
| 3,624,486 | 11/1971 | Oates | 363/41 |
| 3,967,173 | 6/1976 | Stich | 363/41 |
| 4,502,105 | 2/1985 | Jessee | 363/41 |
| 4,685,040 | 8/1987 | Steigerwald et al. | 363/17 |

*Primary Examiner*—Peter S. Wong
*Attorney, Agent, or Firm*—Fliesler, Dubb, Meyer & Lovejoy

[57] ABSTRACT

A switching power supply with an injection signal frequency locking circuit is described comprising a switched transformer controlled by a pulse width modulator. The pulse width modulator output is in turn controlled by an error signal form the output of the power supply such that as the potential on the output of the power supply increases, the duration of the pulses on the output of the pulse width modulator decreases; and conversely, as the potential on the output of the power supply decreases, the pulse duration on the output of the pulse width modulator increases. The increasing and decreasing of the pulse duration on the output of the pulse width modulator controls the length of time that a potential is applied across the primary of the transformer so as to hold the potential on the output of the power supply to a predetermined value. The frequency of the oscillator is fixed by choosing the free-running frequency of the oscillator to be slightly less than a desired fixed predetermined frequency. A signal having the desired fixed predetermned frequency is then injected into the oscillator to reset the oscillator so that the fixed predetermined frequency forces the oscillator to output a sawtooth at the fixed predetermined frequency.

10 Claims, 3 Drawing Sheets

SWITCHING POWER SUPPLY WITH AN INJECTION SIGNAL FREQUENCY LOCKING CIRCUIT

BACKGROUND OF THE INVENTION

1. Cross-Reference to Related Application

U.S. patent application Ser. No. 176,202 entitled "Microwave Measurement System And Associated Method", invented by Martin I. Grace et al, filed on 3/31/88, and owned currently and at the time of invention by a common assignee, is incorporated by reference.

2. Field of the Invention

The present invention relates to power supplies in general and in particular to a switching power supply with an injection signal frequency locking circuit for use in a network analyzer.

3. Description of the Prior Art

A network analyzer is an apparatus for measuring the performance of a network, i.e. a device under test (DUT), over a predetermined range of frequencies. The typical network analyzer comprises a high gain receiver which is sensitive to signals as low as $-100$ db$_{M(50)}$ (the voltage across a 50 ohm resistor dissipating 1 milliwatt of power).

A high gain receiver of the type used in a network analyzer typically comprises several intermediate frequency stages and frequency passbands. Because of the extremely high sensitivity of such receivers, extraneous radio frequency signals which fall within the passbands of the receiver will interfere with the measurements being made.

Power supplies are required in a network analyzer to provide power to operate the various electronic circuits located therein. To eliminate the power supply as a source of radio frequency interference, it has been the practice to use linear power supplies which operate at a relatively low frequency, e.g. 60 Hz.

The typical network analyzer is a relatively high powered device requiring as much as 200 watts of power which must be provided at various potentials. As a consequence, the linear power supply used in a typical network analyzer comprises a relatively large transformer which is quite heavy and requires a great deal of space. Moreover, because the typical linear power supply is relatively inefficient, e.g. 50%, it dissipates a great deal of heat which must be removed from the apparatus.

A switching power supply is another type of power supply which in comparison with a linear power supply having the same power rating, is much more efficient, e.g. 90%, is lighter in weight, requires less space and generates relatively little heat.

A typical switching power supply comprises a transformer having a primary winding across which a potential is applied via a switching circuit at a relatively high frequency. The high switching frequency has the advantage of significantly reducing the size and weight of the transformer. However, it also has the disadvantage of generating radio frequency signals which can interfere with signal processing in radio frequency sensitive receivers. As ambient conditions change, the switching frequency may also change. In most applications, a change in the switching frequency is usually not a problem because the potential output of the supply is not primarily dependent on switching frequency and is regulated by negative feedback. However, in applications comprising radio frequency sensitive receivers, the radio frequency signals generated in a switching power supply can be troublesome, particularly if their frequency changes with changes in ambient conditions and they fall within the passbands of the receiver. For this reason, heretofore, linear power supplies have been the supply of choice for network analyzers, not withstanding their above-described disadvantages.

SUMMARY OF THE INVENTION

For the foregoing reasons, a principal object of the present invention is a switching power supply with a circuit for locking the switching frequency of the supply to a predetermined frequency.

Another object of the present invention is a switching power supply as described above in which the switching frequency is fixed to fall outside the passbands of a receiver in which the supply is used.

In accordance with the above objects, the switching power supply of the present invention comprises a transformer having a primary winding and a secondary winding, a rectifying circuit coupled to the secondary winding, a pulse width modulator, a switching circuit, a negative feedback circuit and an injection signal circuit.

In operation, the modulator, which comprises a sawtooth oscillator, drives the switching circuit for applying positive and negative pulses across the primary winding of the transformer at a frequency which is half the frequency of the oscillator. The pulses are transformed and appear as positive and negative pulses across the secondary winding. The rectifying circuit rectifies the positive and negative pulses appearing across the secondary winding for providing a DC potential having a magnitude which is a function of the magnitude and duration of the rectified pulses.

The negative feedback circuit, which is responsive to the DC potential, comprises a comparator which produces a control signal having a magnitude which is inversely proportional to changes in the magnitude of the DC potential. The control signal controls the output of the modulator for controlling the duration of the pulses applied across the primary and secondary windings. As the DC potential changes due to load and input power line variations from a fixed magnitude, the duration of the pulses applied across the primary and secondary windings is changed. That is, as the DC potential drops, the duration of the pulses is increased. As the DC potential increases, the duration of the pulses is decreased.

The sawtooth oscillator has a nominal free-running frequency which can change in response to changes in ambient conditions. To lock the sawtooth oscillator to a fixed predetermined frequency, a reference signal having the predetermined frequency is provided by a system clock and is injected into the modulator to reset the sawtooth oscillator. Accordingly, the free-running frequency of the oscillator is chosen to be slightly less than, e.g. 5% of the predetermined reference frequency. The predetermined reference frequency is chosen to be outside the passbands of the receiver in which the supply is used.

BRIEF DESCRIPTION OF THE DRAWINGS

The above and other objects, features and advantages of the present invention will become apparent from the following detailed description of the accompanying drawings, in which.

DETAILED DESCRIPTION OF THE DRAWING

Figure 1:
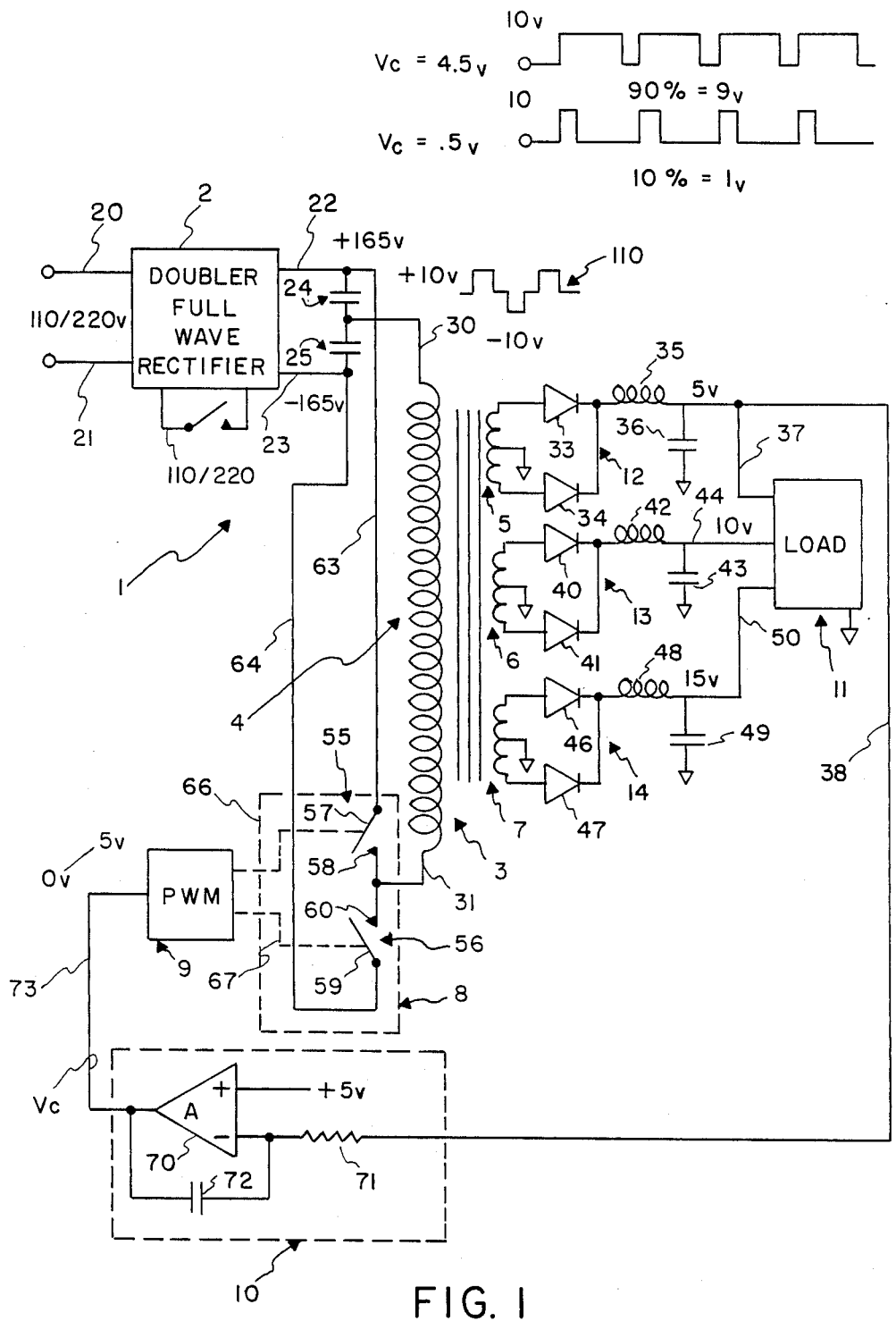
FIG. 1 is a block diagram of a switching power supply with an injection signal frequency locking circuit according to the present invention.

Referring to FIG. 1, there is provided in accordance with the present invention a switching power supply designated generally as 1. In the supply there is provided a voltage doubler/full wave rectifier circuit 2, a transformer 3 having a primary winding 4 and a plurality of tightly couple secondary windings 5, 6 and 7, a primary winding switching circuit 8, a pulse width modulator 9, an error amplifier circuit 10, a load 11 and a plurality of rectifying circuits 12, 13 and 14 coupled to the secondary windings 5, 6 and 7, respectively.

In the voltage doubler/full wave rectifier circuit 2 there is provided a pair of input lines 20 and 21 and a pair of output lines 22 and 23. The input lines 20 and 21 are provided for coupling the circuit 2 to a source of 110/220 V, 60 Hz power. Coupled between the output lines 22 and 23 there is provided a pair of capacitors 24 and 25. A selection switch 110/220 is provided for selecting either the voltage doubler or the rectifier so as to maintain ±165 volts DC to the capacitors 24 and 25.

In the transformer 3 one end of the primary winding 4 is coupled to a node located between the capacitors 24 and 25 by means of a line 30. The opposite end of the primary winding 4 is coupled to the switching circuit 8 by means of a line 31. In each of the secondary windings 5-7 there is provided a center tap which is coupled to ground. The opposite ends of the winding 5 are coupled to the anodes of a pair of diodes 33 and 34, respectively. The cathodes of diodes 33 and 34 are coupled to an inductor 35. The opposite end of the inductor 35 is coupled to ground through a capacitor 36, to the load 11 by means of a line 37 and to the error amplifier circuit 10 by means of a line 38. The opposite ends of the secondary winding 6 are coupled to the anodes of a pair of diodes 40 and 41, respectively. The cathodes of the diodes 40 and 41 are coupled to an inductor 42. The opposite end of the inductor 42 is coupled to ground through a capacitor 43 and to the load 11 by means of a line 44. The opposite ends of the winding 7 are coupled to the anodes of a pair of diodes 46 and 47, respectively. The anodes of the diodes 46 and 47 are coupled to one end of an inductor 48. The opposite end of the inductor 48 is coupled to ground through a capacitor 49 and to the load 11 by means of a line 50.

The turns in the primary winding 4 and the secondary windings 5-7 are chosen so as to provide various potentials to the load 11, e.g. 5 volts, 10 volts, 15 volts, etc. As will be further described below, a change in the potential on line 38 from a predetermined potential, e.g. 5 volts, will produce a change in the potential across winding 5. Because of the tight coupling of the secondary windings, this will in turn produce a corresponding change across the windings 6 and 7 so as to maintain their potentials at predetermined values, e.g. 10 volts and 15 volts, respectively.

In the switching circuit 8 there is provided a pair of switches 55 and 56. In the switch 55 there is provided a wiper 57 and a contact 58. In the switch 56 there is provided a wiper 59 and a contact 60. The contacts 58 and 60 are coupled to the primary winding 4 of the transformer 3 by means of the line 31. The wiper 57 in the switch 56 is coupled to the output line 22 of the full wave rectifier 2 by means of a line 63. The wiper 59 in the switch 56 is coupled to the output line 23 of the full wave rectifier 2 by means of a line 64. The closing and opening of the wipers 57 and 59 are controlled by the pulse width modulator 9 as shown by the broken lines 66 and 67. While the switching circuit 8 is shown as comprising mechanical switch parts, it is to be understood that in the preferred embodiment of the present invention, the switch 8 is actual a solid state switch.

In the error amplifier circuit 10 there is provided an error amplifier 70. The negative input of the amplifier 70 is coupled to the line 38 from the circuit 12 by means of a resistor 71. The positive input to the amplifier 70 is coupled to a +5 volt supply. The negative input of the amplifier 70 is also coupled to the output of the amplifier 70 by means of a capacitor 72. The output of the amplifier 70 is also coupled to the input of the pulse width modulator 9 by means of a line 73 for providing a control voltage $V_C$ to the pulse width modulator 9.

Figure 2:
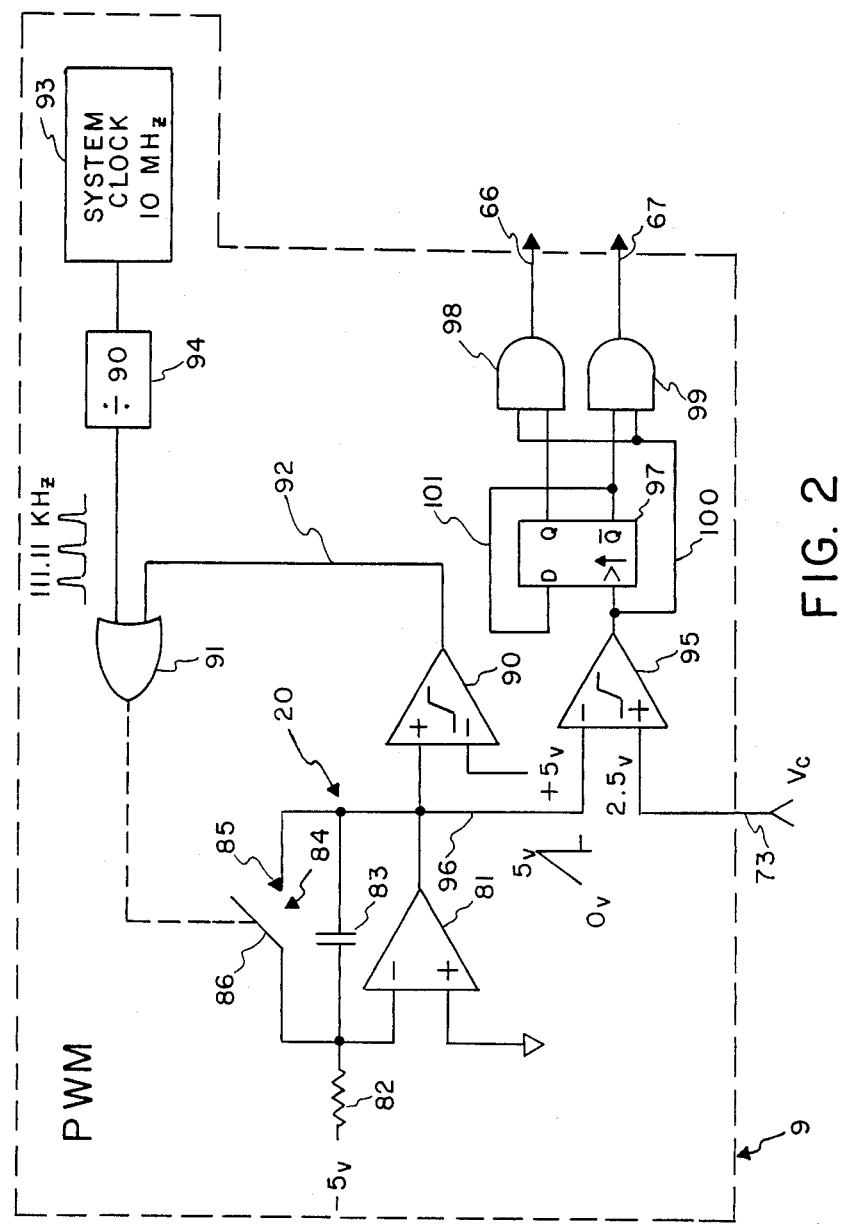
FIG. 2 is a block diagram of a pulse width modulation circuit according to the present invention.

Referring to FIG. 2, there is provided in the pulse width modulator 9 a sawtooth oscillator circuit 80. In the circuit 80 there is provided an amplifier 81. The negative input of the amplifier 81 is coupled to a source of negative potential, e.g. −5 volts, through a resistor 82 and to its output through a capacitor 83 and a switch 84. In the switch 84 there is provided a contact 85 and a wiper 86. The positive input of the amplifier 81 is coupled to ground. The output of amplifier 81 is coupled to the positive input of a comparator 90. The negative input of the comparator 90 is coupled to a +5 volt supply. The output of the comparator 90 is coupled to an OR gate 91 by means of a line 92. A second input of the OR gate 91 is coupled to a 10 MHz system clock 93 by means of a divide-by-90 circuit 94. The output of the OR gate 91 is coupled to the wiper 86 in the switch 84 to open and close the switch. As described above with respect to the switching circuit 8, the switch 84 in a preferred embodiment of the present invention comprises a solid state switch. The output of the amplifier 81 is also coupled to the negative input of a comparator circuit 95 by means of a line 96. The positive input of the comparator 95 is coupled to the voltage control signal line 73. The output of the comparator 95 is coupled to the clock input of a D flip-flop 97 and to a first input of a pair of AND gates 98 and 99 by means of a line 100. The true output Q of the flip flop 97 is coupled to a second input of the AND gate 98. The complementary output $\bar{Q}$ of flip-flop 97 is coupled to a second input of AND gate 99 and to the D input of the flip-flop 97 by means of a line 101. The outputs of the AND gates 98 and 99 are coupled, respectively, to the wiper 57 of the switch 55 in the switching circuit 8 by means of the line 66 and to the wiper 59 of the switch 56 in the switching circuit 8 by means of the line 67 to open and close the switches.

In operation, a 110/220 V, 60 Hz power source is applied to the input lines 20 and 21 of the rectifier 2. In response, the rectifier 2 provides on its output lines 22 and 23 a DC potential of ±165 volts, respectively. Under the control of the pulse width modulator 9, the switching circuit 8 provides ±165 volt DC pulses alternately across the primary winding 4 of the transformer 3. The primary winding 4 and the secondary windings 5-7 then cooperate to produce positive and negative pulses on the secondary windings at a lower potential, the magnitude of which depends upon the respective turn ratios of the primary and secondary windings. As will be further described below, the duration of the pulses depends on the length of time the switches 55 and 56 are closed.

The positive and negative pulses thus produced on the windings 5-7 are then rectified by the diodes 33 and 34, diodes 40 and 41 and diodes 46 and 47, respectively, for providing on the output of each set of diodes a train of positive pulses. The three trains of positive pulses are then integrated by the inductor 35 and capacitor 36 coupled to the circuit 12, the inductor 42 and capacitor 43 coupled to the circuit 13 and the inductor 48 and capacitor 49 coupled to the circuit 14, respectively, to provide predetermined nominal DC potentials, e.g. +5 volts, +10 volts, +15 volts, on the lines 38, 44 and 50, respectively.

To maintain the potential on the lines 37 and 38 at a predetermined potential, e.g. +5 volts, the potential on the line 38 is coupled to the input of the error amplifier circuit 10 and compared against a reference potential of +5 volts. If the potential on the line 38 rises above +5 volts, the magnitude of the control voltage $V_C$ on the output of the amplifier 70 in the circuit 10 decreases so as to return the potential on the line 38 to its predetermined +5 volts. Conversely, if the potential on the line 38 falls below +5 volts, the output of the amplifier 10 increases to return the potential on the line 38 to its predetermined +5 volts.

Figure 3:
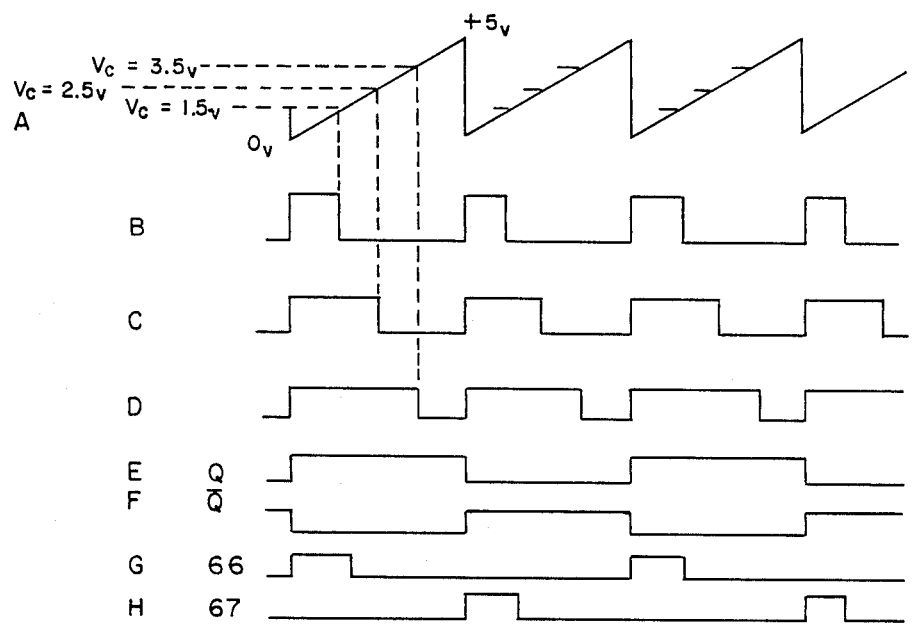
FIG. 3 comprises eight waveforms A, B, C, D, E, F, G and H representative of signals in the circuit of FIG. 2.

Referring to FIG. 2, the sawtooth oscillator 80 provides on the output of the amplifier 81 a sawtooth signal which varies from 0 to approximately +5 volts at a predetermined nominal free-running frequency, e.g. 105 KHz as shown in waveform A of FIG. 3. As will be seen below, in practice the injection signal locking circuit which locks the oscillator 80 to a predetermined higher frequency will normally prevent the output of oscillator 80 from reaching +5 volts. The sawtooth output is applied to the positive input of the comparator 95 and compared with the potential $V_C$ from the output of the error amplifying circuit 10. In a preferred embodiment of the present invention, the nominal output of the error amplifying circuit 10 is chosen to be 2.5 volts when the potential on line 38 is at +5 volts. With $V_C$=+2.5 volts, the output of comparator 95 will be high until the sawtooth signal reaches +2.5 volts, at which time it will go low until the sawtooth signal falls below +2.5 volts as shown in waveform C of FIG. 3. Under these conditions, the output of the comparator 95 comprises a 50% duty cycle. If, however, the potential on the line 38 falls below +5 volts, the output of the error amplifying circuit 10 will increase. For example, if the output of the error amplifying circuit increases to +3.5 volts, there will be a corresponding increase in the duration of the pulse on the output of the comparator 95 as shown in waveform D of FIG. 3. Conversely, if the potential on the line 38 increases above +5 volts, the output $V_C$ of the error amplifying circuit 10 will decrease. For example, if the output of the error amplifying circuit decreases to +1.5 volts, there will be a corresponding decrease in the duration of the pulses on the output of the comparator 95 as shown in waveform B of FIG. 3.

The rising edge of each of the pulses from the comparator 95 are used to drive the flip-flop 97 so as to provide true and complementary outputs therefrom at half the frequency of the output of the oscillator 80 as shown in waveforms E and F of FIG. 3. These outputs are then applied to AND gates 98 and 99, respectively, together with the output of the comparator 95 to produce on the outputs of the AND gates 98 and 99 pulses having the same duration as the pulses generated at the output of comparator 95, but at half the frequency. For example, if the output of the comparator 95 comprises the pulse train as shown in waveform B of FIG. 3, then the outputs of AND gates 98 and 99 will appear as shown in waveforms G and H, respectively. The length of time that the switches 55 and 56 are closed corresponds to the duration of the pulses on the outputs of the AND gates 98 and 99, respectively. Since the magnitude of the potential on the lines 37, 44 and 50 depends on the length of time that the switches 55 and 56 are closed, the potential on these lines is controlled by the output of the modulator 9.

As a free-running sawtooth oscillator, the circuit 80 of FIG. 2 as thus far described is subject to changes in ambient conditions which can result in changes in the free-running frequency of the oscillator. To lock the frequency of the oscillator to a predetermined frequency, the sawtooth output of the oscillator is coupled to the positive input of the comparator 90 and compared against a +5 volt potential. When the sawtooth input applied to the positive input of comparator 90 reaches +5 volts, the output of the comparator 90 goes from a low to a high. When this occurs, the output of the OR gate 91 closes the switch 84, resetting the oscillator, i.e. causes the output of the oscillator 80 to fall from +5 volts to 0 volts. To lock the frequency of the sawtooth oscillator to a predetermined frequency, e.g. 111 KHz, the system clock 93 which has a frequency of 10 MHz is divided by 90 to produce a pulse train of relatively sharp pulses having a frequency of approximately 111 KHz. Because the frequency of 111 KHz is 4% to 5% higher than the free-running frequency of the oscillator 80, the 111 KHz pulses will reset the oscillator 80 before it reaches its maximum +5 volt potential, thus causing the oscillator 80 to lock to In general, as long as the frequency of the output of the oscillator 80 is outside the passbands of the receiver in which the oscillator is used, the radio frequency signals which are generated will not interfere with the normal processing of signals in the receiver. As described above, this is extremely important for the high gain, sensitive receivers used in network analyzers. Furthermore, the locking of the frequency to a predetermined fraction of the system clock in the analyzer will insure that the frequency will not be changed adversely due to changes in ambient conditions. In passing, it should be noted that initially the oscillator 80 will be free-running at least until the system clock, which is powered by the supply, begins operating. At that time, the oscillator 80 frequency will be locked by the system clock.

While a preferred embodiment of the present invention is described above, it is contemplated that various modifications may be made thereto without departing from the spirit and scope of the present invention. For example, while specific frequencies and potentials are mentioned, other frequencies and potentials may be used to satisfy the requirements of a particular application. Accordingly, it is intended that the embodiment described be considered only as an illustration of the present invention and that the scope thereof should not be limited thereto but be determined by reference to the claims hereinafter provided.

What is claimed is:

1. A switching power supply comprising:
   an oscillator for providing a periodic sawtooth output signal which changes from a first potential toward a second potential; and
   means responsive to a periodic reference signal having a predetermined frequency for resetting said output signal of said oscillator to said first potential before said output signal of said oscillator reaches said second potential at said predetermined frequency.

2. A supply according to claim 1 wherein said oscillator comprises an input and an output, a capacitor coupled between said input and said output and means for charging said capacitor, and said resetting means comprises means for discharging said capacitor at said predetermined frequency.

3. A supply according to claim 1 wherein said resetting means comprises means responsive to said output of said oscillator for resetting said output of said oscillator to said first potential whenever said output of said oscillator reaches said second potential.

4. A supply according to claim 1 comprising means responsive to said output signal of said oscillator and a DC reference signal having a magnitude for providing a plurality of pulses at said predetermined frequency, each of said plurality of pulses having a duration which is proportional to said magnitude of said DC reference signal.

5. A supply according to claim 4 wherein said plurality of pulses comprise a first plurality of pulses and comprising means responsive to said first plurality of pulses for providing a second and a third plurality of pulses at half said predetermined frequency, each pulse in said second and said third plurality of pulses having a duration substantially equal to the duration of each pulse in said first plurality of pulses.

6. A supply according to claim 5 wherein said second and said third plurality of pulses providing means comprises first means responsive to said first plurality of pulses for dividing the frequency of said first plurality of pulses in half and second means responsive to said dividing means and said first plurality of pulses for providing said second and said third plurality of pulses.

7. A supply according to claim 5 comprising:
   a transformer having a primary winding; and
   means responsive to said second and said third plurality of pulses for alternately applying a positive and a negative DC potential across said primary winding at the frequency of said second and said third plurality of pulses, respectively, and, with respect to each of said pulses, for a period of time substantially equal to the duration of said pulse.

8. A supply according to claim 7 wherein said positive and said negative DC potential applied alternately across said primary winding comprises a first and a second potential and means responsive to said first and said second potential for providing a third DC potential having a magnitude which is proportional to the time said first and said second DC potential is applied across said primary winding.

9. A supply according to claim 8 wherein said third DC potential providing means comprises:
   a center-tapped secondary winding in said transformer;
   a diode circuit having an output coupled to said secondary winding; and
   means for integrating the output of said diode circuit.

10. A supply according to claim 4 comprising an output potential and means responsive to a change in the magnitude of said output potential for changing said magnitude of said DC reference signal by an amount inversely proportional to said change in the magnitude of said output signal.

* * * * *

UNITED STATES PATENT AND TRADEMARK OFFICE
CERTIFICATE OF CORRECTION

PATENT NO. : 4,858,097

DATED : August 15, 1989

INVENTOR(S) : DONALD A. BRADLEY

It is certified that error appears in the above-identified patent and that said Letters Patent is hereby corrected as shown below:

```
Column 3, line 16, "couple" should be --coupled--.
Column 4, line 51, "Q" should be --Q--.
Column 6, line 39, after "lock to" insert --111 KHz.--.
```

Signed and Sealed this

Tenth Day of July, 1990

Attest:

HARRY F. MANBECK, JR.

Attesting Officer

Commissioner of Patents and Trademarks